United States Patent [19]

Sevigny

[11] Patent Number: 4,597,174

[45] Date of Patent: Jul. 1, 1986

[54] INTEGRATED CIRCUIT CHIP INSERTION AND REMOVAL TOOL

[75] Inventor: Roger Sevigny, Hartford, Conn.

[73] Assignee: United Technologies Corporation, Hartford, Conn.

[21] Appl. No.: 775,924

[22] Filed: Sep. 13, 1985

Related U.S. Application Data

[63] Continuation of Ser. No. 540,961, Oct. 11, 1983, abandoned.

[51] Int. Cl.⁴ .............................................. H05K 3/32
[52] U.S. Cl. ........................................ 29/741; 29/764
[58] Field of Search ................. 29/741, 764, 278, 758

[56] References Cited

U.S. PATENT DOCUMENTS

| | | | |
|---|---|---|---|
| 3,443,297 | 5/1969 | Lusby, Jr. | 29/764 |
| 3,538,580 | 11/1970 | Bruner | 29/764 X |
| 3,896,533 | 7/1975 | Ullman et al. | 29/764 X |
| 3,974,556 | 8/1976 | Kubik | 29/764 |

Primary Examiner—Carl E. Hall
Attorney, Agent, or Firm—Francis J. Maguire, Jr.

[57] ABSTRACT

A device for removing and inserting an IC chip from its installation.

1 Claim, 5 Drawing Figures

INTEGRATED CIRCUIT CHIP INSERTION AND REMOVAL TOOL

This is a continuation of application Ser. No. 540,961, filed on Oct. 11, 1983, now abandoned.

TECHNICAL FIELD

This invention relates to tools for inserting and removing integrated circuit chips into and from their installations.

BACKGROUND ART

As known in the art, a hand tool may be used to engage an integrated circuit chip (IC chip) and either install or remove the chip from its installation. A typical tool utilizes a set of jaws each having a row of teeth for insertion between the pins of the chip. In the typical prior art tool, the jaws are held in the closed position with spring tension and are forced into the open position with a hand operated plunger which may be forced between the jaws thereby causing them to open so that the jaws may be positioned to accept a chip within and have the teeth aligned with the spaces between the pins. The plunger may then be withdrawn thereby allowing the jaws to close around the chip with the teeth fully inserted between the pins.

In this engaged position, an IC chip may be removed from its installation by exerting a pulling force on the tool so that the underside of the chip is engaged by the teeth and the pulling force is distributed between the teeth in the pulling direction and the chip is removed. It is important to exert the pulling force in a direction perpendicular to the surface of the installation so that the chip is removed straight out. This prevents the bending of the chip's pins which are extremely delicate. This is often difficult to achieve, especially with chips having a larger number of pins, because of the high degree of hand-eye coordination required. Although many IC chips are mounted in sockets whereby the chip is held in place merely by the spring tension exerted against its individual pins in their sockets and other chips may be similarly susceptible to easy removal, some installations require that a chip be bonded on its underside with a heat conductive adhesive to a heat sink. The removal of such a chip with a prior art hand tool without bending any pins is extremely difficult at best.

An IC chip may also be inserted into its installation with the prior art hand tool. With the jaws fully engaged around the chip the tool may be oriented so that the pins are aligned with their receptacles in the installation and pushed in. The jaw's teeth in this case are not used to exert the pushing force but merely to hold the chip in proper alignment within the tool. The actual pushing forces are exerted against the top surface of the chip with projecting surfaces within each jaw which may be a projecting ledge or lip or sets of tabs. Again, it is difficult to coordinate the eye and hand in the manner necessary to exert the substantially perpendicular force required to insert a chip without bending its pins.

With training and experience some adeptness at removing or inserting IC chips may be developed using the prior art hand tool. However, some degree of damage to the pins of at least some chips will still occur even among the more experienced users. Considering the expense involved in the development of such a skill and the concomitant expense for discovering and replacing damaged chips, the prior art method of inserting and removing IC chips from their installations can result in unnecessary expense and waste.

DISCLOSURE OF INVENTION

The object of the present invention is to provide an integrated circuit (IC) chip removal and insertion hand tool that prevents the bending of the pins of the chip when removing or inserting a chip from or into a mounting.

According to the present invention, an IC chip insertion and removal hand tool having an outer bracket for holding an inner bracket with jaws and for guiding its motion perpendicularly with respect to the surface of a circuit board, from or into which an IC chip is sought to be removed or inserted without bending its pins, is provided by first aligning a pair of splayed jaws with respect to the chip so that the teeth of each jaw are positioned between the chip's pins, and then forcing the jaws shut around the chip by drawing the inner jaw bracket partially into the outer bracket along its guides thereby forcing the jaws shut against rails attached to the legs, thereby shutting the jaws and at the same time positioning the outer bracket securely with respect to the position of the IC chip, so that the chip's surface is positioned perpendicularly to the guided direction of extraction or insertion and then either removing or inserting the chip by pulling or pushing the jaw bracket perpendicularly away from or toward the circuit board along the guides within the outer housing.

The present invention accommodates the need for an improved IC chip insertion and removal hand tool by forcing the user to orient the surface of the chip parallel to the circuit board during insertion or removal by causing the forces exerted by the user in either removing or inserting the chip to be distributed evenly over the surface areas of the chip, so that all the legs of the chip are either pushed straight in or pulled straight out of the circuit board without being bent. The degree of hand-eye coordination required of the user is reduced to a bare minimum so that the difficult task of inserting or removing an IC chip straight in or out of the circuit board is greatly eased. This is true not only for the especially difficult task of removing a chip which has been thermally bonded with a heat conductive adhesive to a heat sink where a great deal of properly distributed and directed force is required, but also for the relatively easy task of removing a chip from a socket where only spring tension holds the legs and no adhesive is used. Thus, the training and experience necessary for a user to successfully remove or insert such IC chips is greatly reduced.

The invention may be practiced on a variety of IC chips having any number of legs and being mounted in a variety of mountings. Several different sizes of hand tools having different numbers of teeth and different overall dimensions are sufficient for handling most IC chip insertion and removal tasks since the construction of such chips and also their mountings are highly standarized in the industry.

The foregoing and other objects, features and advantages of the present invention will become more apparent in the light of the following detailed description of the best mode embodiment thereof, as illustrated in the accompanying drawing.

BEST MODE FOR CARRYING OUT THE INVENTION

Figure 2:
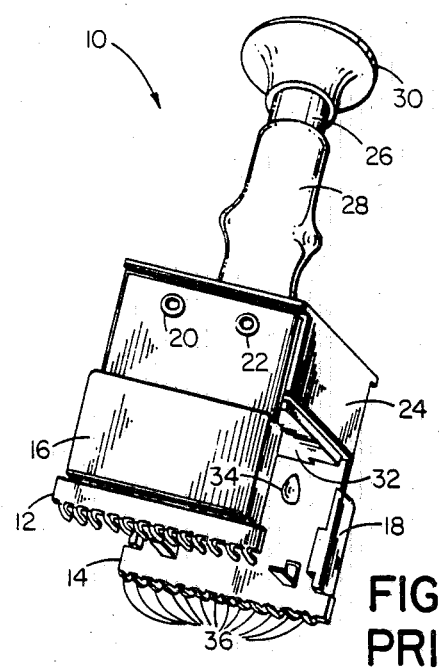
FIG. 2 is a sketch of a prior art IC chip insertion and removal tool.

In FIG. 2, a prior art IC chip insertion and removal tool 10 is illustrated. A set of jaws 12, 14 is shown in the closed position, i.e. the position necessary to fully engage an IC chip and either remove or insert it from its installation. An individual jaw is cut out of a thin sheet of metal. Finger grips 16, 18 may be attached to the jaws for convenience. The jaws are attached with rivets 20, 22 to a plunger assembly 24. The plunger assembly includes a plunger shaft 26 within a plunger outer sheath 28, a push button 30, and a plate 32. The user may force the jaws open by depressing the plunger shaft into its sheath thereby forcing the plate 32 against a dimple 34 or a set of such dimples arranged within the inner surfaces of the jaws, thereby forcing the jaws open due to the cam-like action of the plate against the dimple. After opening the jaws the tool is oriented around an IC chip so that individual teeth 36 disposed on a given jaw 14 may be aligned with the spaces between the pins on the chip. Once the teeth are aligned with the spaces between the pins, the plunger shaft is withdrawn from its sheath so that the natural spring action of the sheet metal acts to reclose the jaws into their resting position thereby engaging the IC chip. Once the chip is engaged in this fashion, it may be either inserted or removed from its installation. However, great care must be exercised by the user to ensure that the chip is inserted or removed in a substantially perpendicular direction to the surface of the installation. Otherwise, the extremely delicate pins of the IC chip will be bent or broken.

Figure 1:
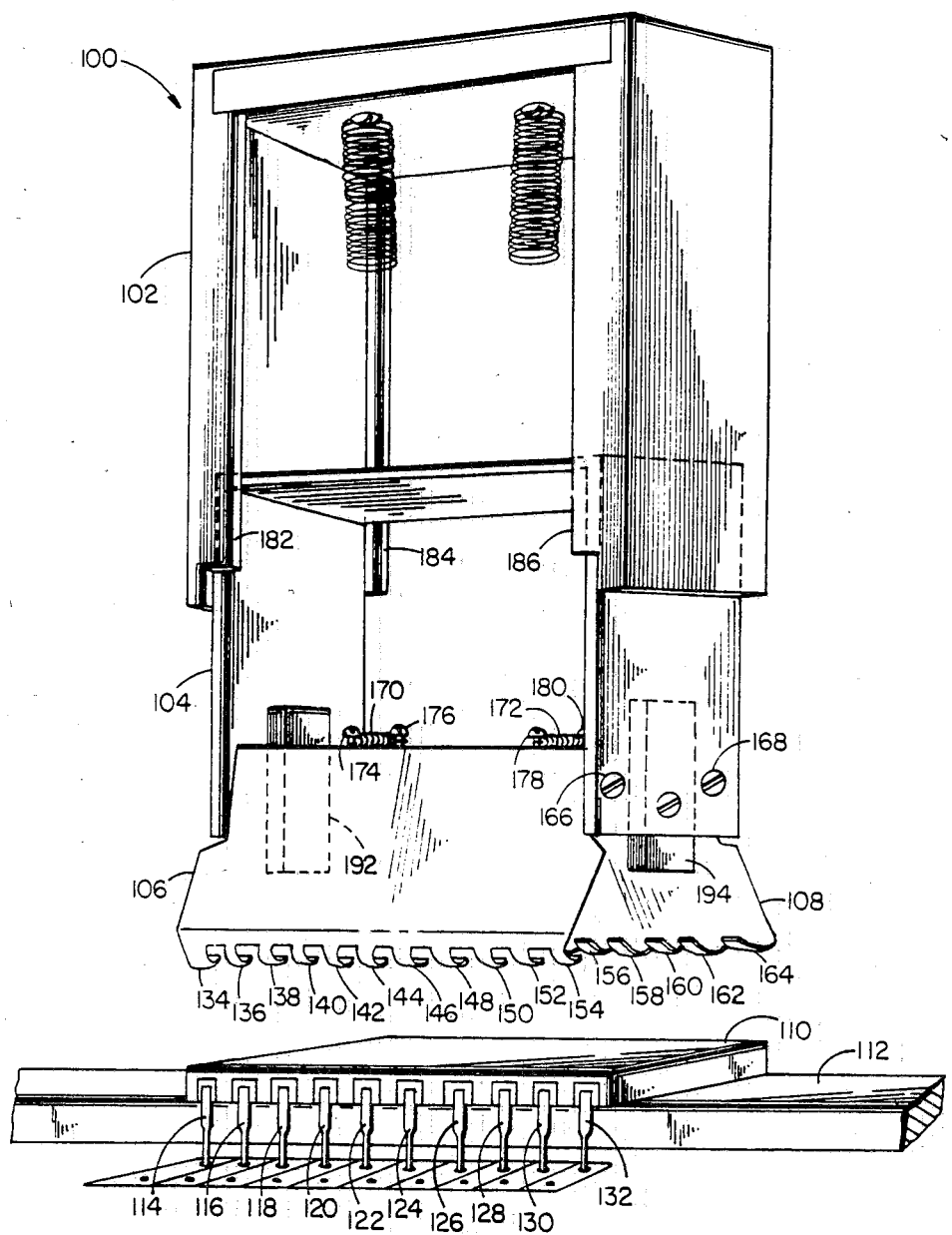
FIG. 1 is a sketch of the IC chip insertion and removal tool of the present invention.

Referring now to FIG. 1, the IC chip insertion and removal tool 100 of the present invention is illustrated. An outer bracket 102 is shown slideably engaging an inner bracket 104 upon which is mounted a pair of jaws 106, 108. The tool 100 is shown positioned above an IC chip 110 which is mounted on a heat sink 112. The IC chip has a plurality of pins 114–132 which serve as electrical connections between the IC chip and the electrical contacts within the installation. Not shown in the illustration of FIG. 1 is an identical row of pins disposed along the opposite edge. The number of pins on a given IC chip can vary widely. For example, standardized chips within the industry may be provided with 14, 16, 18, 22, 40, or any other number of pins. The tool 100 illustrated in FIG. 1 is shown with a sufficient number of teeth to fully engage a 20 pin IC chip. However, it should be understood that other tools, having a greater or lesser number of teeth could as easily be designed to match a particular chip. It should also be understood that is possible to remove several different types of chips with a single tool. In other words, a tool need not have the same number of teeth as the chip to be removed or inserted has spaces between pins in order to properly remove or insert the chip. This is due to the fact that the distance between pins is standardized within the industry and chips having different numbers of pins retain the same spacing between pins.

A number of teeth 134–164 of the jaws 106, 108 are illustrated. The jaws are shown rotated open on pivots 166, 168, two of which are shown. The jaws are held open in this fashion by spring tension provided by springs 170, 172 which are stretched between the top edges of both jaws. The springs are attached to screws 174, 176, 178, 180 mounted on the top edges of the jaws. The placement of the jaws 106, 108 on the inner bracket 104 is selected so that when the jaws are rotated fully closed the teeth fully engage the underside of the chip without causing any pressure to be exerted by the side walls of the jaws on the outer edge of the chip. Thus, the jaws are designed to embrace the chip when in the closed position but only loosely; the jaws thus serve merely to provide support for the teeth which are inserted under the portion of the chip overhanging the heat sink thereby being in a position to be used to lift the IC chip 110 from its installation or to be used to orient the chip for insertion into its installation.

Once the open jaws have been oriented around a chip the jaws are closed by retracting the inner bracket 104 further into the outer bracket 102. Each of the parallel legs of the outer bracket 102 slideably engages the corresponding parallel leg of the inner bracket 104. Additionally, each parallel leg of the outer bracket includes a pair of notched guide rails 182, 184, 186, three of which are shown in FIG. 1. The guide rail serves the dual function of first guiding the inner bracket 104 along a straight line within the outer bracket 102 and second, forcing the jaws 106, 108 closed whenever the inner bracket is retracted sufficiently far into the outer bracket 102 as to cause the rails 182, 184, 186 to interfere with the jaws in their open position thereby urging the jaws to close. As the inner bracket is further retracted into the outer bracket, the jaws are urged into a more fully closed position until the retraction is sufficient to cause full closure.

Figure 3:
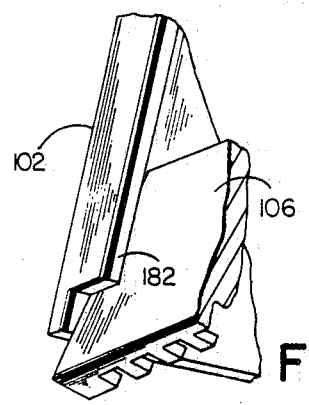
FIG. 3 is a detailed view of a jaw being engaged by a guide rail.

Referring now to FIG. 3, a jaw 106 is shown almost completely closed by being forced against the interfering notched guide 182 as the inner bracket (not shown) is retracted within the outer bracket 102. The notched portion of the guide rail is cut out so as to prevent the guide rail from interfering with the corners of the chip as mounted on its installation. It should be understood that the size of the notch may be varied according to the particular application. For example, if a tool is intended to be used primarily with chips mounted in sockets, the height of the notch will necessarily be significantly higher than it would be for chips mounted merely on circuit boards.

Referring back to FIG. 1, if the IC chip 110 mounted on the heat sink 112 is sought to be removed from its installation, the tool 100 is positioned over the chip 110 as shown and then lowered over the chip so that the jaws encompass it in such a way as to cause each of the teeth 134–164 to be aligned with the spaces between the pins 114–132. With the inner bracket 104 and its jaws 106, 108 resting on the chip's installation with the teeth ready for insertion, the outer bracket is slideably engaged so as to cause the inner bracket 104 to be retracted therein in the manner shown in FIG. 4.

Figure 4:
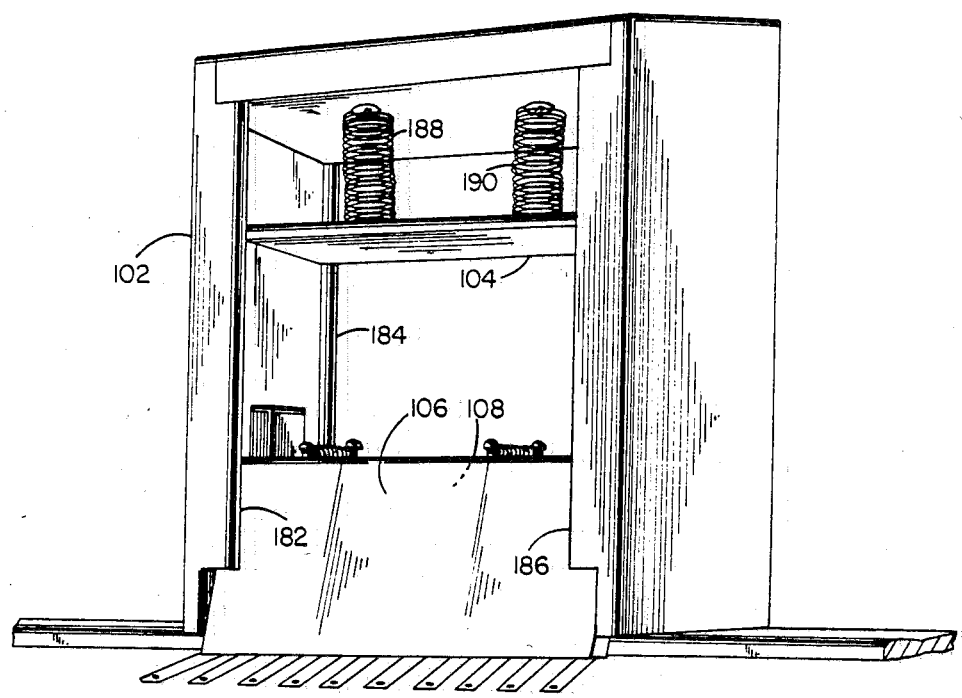
FIG. 4 is a sketch of the tool of the present invention erected upon a heat sink upon which is mounted an IC chip (not shown) encompassed by the jaws of the tool.

As shown in FIG. 4, the outer bracket 102 has been forced downwards over the inner bracket 104 so as to cause the jaws 106, 108 to be partially closed and engaged around the chip. As shown in FIG. 4, the jaws are not yet completely closed since they have not yet been completely withdrawn into the guide rails 182, 184, 186. It should be observed that the inner bracket, as it is withdrawn into the outer bracket 102 to the degree shown in FIG. 4, begins to encounter resistance to further retraction from spring tension provided from springs 188, 190. These are provided in order to cushion the effects of any excessive forces exerted by the user at the time of chip removal when the chip may be suddenly released.

Figure 5:
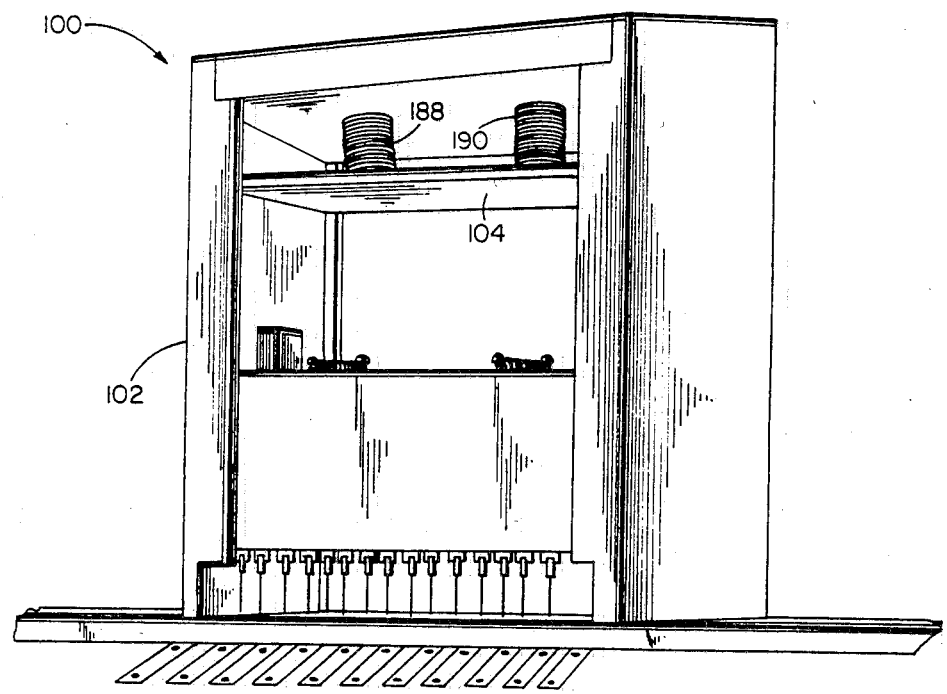
FIG. 5 is a sketch of the tool of the present invention shown with the jaws fully retracted within the outer bracket having an IC chip fully engaged within the jaws and removed from its installation.

Referring now to FIG. 5, an IC chip is shown removed from its installation by the tool 100 having its inner bracket 104 fully retracted against the spring tension provided by the springs 188, 190. The jaws, in this illustration, are shown fully closed with the guide rails completely covering the toothed edges of the jaws.

It should be observed in both FIG. 4 and FIG. 5 that the outer bracket 102 is erected perpendicularly to the surface of the IC chip's installation. This is accomplished by having the lower edge of each of the parallel legs perpendicular to the direction of movement of the inner bracket within the guide rails. Thus, when the outer bracket is forced down over the inner bracket for the purpose of partially closing the jaws around the IC chip it is at the same time firmly erected perpendicularly to the surface of the chip's installation. In this manner the further retraction of the inner bracket within the outer bracket causes the IC chip to be removed from its installation in a straight line along guides that are perpendicular to both its surface and also the surface of its installation thereby causing it to be pulled straight out. This is accomplished by evenly distributing the lifting forces between the teeth on the under surface of the chip. Thus, the chip is removed without bending or breaking any legs.

Referring back to FIG. 1, it is seen that the tool 100 of the present invention may be utilized as well to insert an IC chip into its installation. This may be accomplished by extending the inner bracket 104 in such a way as to cause its jaws 106, 108 to be fully opened and by then causing the jaws to encompass a chip and by then retracting the inner bracket into the outer bracket in such a way as to cause the jaws to be fully closed around the chip as shown in FIG. 5. The outer bracket 102 may then be perpendicularly erected upon the intended installation for the chip. Once the outer bracket is firmly in place and the pins are properly aligned with their intended receptacles, the inner bracket may then be extended so as to cause the chip to be in a position to be pushed into its installation. Referring to FIG. 1, a pair of pushing surfaces 192, 194 are utilized for this purpose. As may be seen from the figure, the pushing surfaces are located within the jaws so as to be in a position to exert pushing forces at each end of the chip. Thus, the tool 100 of the present invention may also be used as an insertion tool which permits the proper alignment and equal distribution of insertion forces so as to allow insertion without bending or damage to pins.

It should be understood by those skilled in the art, that the IC chip removal and insertion device of the present invention could be implemented as simply an insertion tool or, alternatively, as simply a removal tool. It should also be understood that the present invention need not necessarily be embodied in a hand tool but could as easily be incorporated in a machine for the automated insertion or removal of IC chips from circuit boards, sockets, or other like installations. In such an embodiment, the parallel legs of the outer bracket need not be erected directly onto the surfaces of the installation but might be fixed firmly in space by some other means not requiring direct contact with the surface of the installation. Similarly, the method of guiding the inner bracket need not be restricted to a device having parallel legs but could merely be a single leg fixed in space perpendicularly with respect to the surface of the installation. The inner bracket could also be made up of only a single member slideably engaging a single member outer bracket. It is of course apparent that a full compliment of four guide rails for the purpose of closing the jaws is not absolutely necessary and can be accomplished using a lesser number, especially if the inner and/or outer brackets are single member entities. It should also be understood that the jaws need not be pivoted so long as the desired end of the closing around the chip with the teeth is accomplished. Also, one of the jaws may be immobile. It should also be understood that the jaws need not necessarily be pivoted on a fixed axis. They could be attached to an accordion-like structure which might be opened and closed using a method which would be according to the spirit of the invention, but not precisely in accordance with the best mode embodiment. Thus, although the invention has been shown and described with respect to a best mode embodiment thereof, it should be understood by those skilled in the art that the foregoing and various other changes, omissions, and additions in the form and detail thereof may be made therein without departing from the spirit and scope of the invention.

I claim:

1. A hand tool for removing and inserting an IC chip (110) from its installation, comprising:
   a U-shaped inner bracket (104) having two parallel legs joined by a connecting section;
   a pair of pivoting jaws (106, 108) mounted along parallel pivot axes across the open end of the U-shaped inner bracket between the two parallel legs;
   teeth (134–164), spaced at selected intervals along a grasping edge of each jaw, the intervals corresponding to intervals between the pins of the IC chip for insertion therebetween on the underside of the IC chip;
   extension coil spring means (170, 172), connected between the pair of jaws for splaying the jaws open about their pivot axes;
   insertion means (192, 194), mounted on the inside surfaces of the two parallel legs of the U-shaped inner bracket and extending within the jaws for being positioned on the surface of an IC chip grasped by the jaw, for distributing forces exerted by the inner bracket on the chip surface during insertion of an IC chip into its installation;
   U-shaped outer housing guide means (102), for slideably engaging the inner bracket along its two legs during retraction and extension of the inner bracket therein and therefrom, the sliding action actuated by externally and alternately supplied, oppositely directed retracting (for extracting a chip) and extending (for inserting a chip) forces applied by hand to the connecting section of the inner bracket, the guide means for guiding the inner bracket including jaws in alternate extended and retracted directions during extension and retraction of the inner bracket, the guide means having rails (182, 184, 186) for permitting the jaws to open when the inner bracket is extended for aligning the jaw teeth between the legs of the IC chip to be removed or inserted from or into its installation, said rails interfering with and thereby forcing the jaws to close and grasp the IC chip when partially retracted into the outer housing both, for extraction, (i) as the outer housing is forced by hand down over an inner bracket positioned for grasping an installed IC chip to be removed from its installation, (ii) as the outer housing is seated by hand on an IC chip installation surface (112), and (iii) as the chip is extracted from its installation during full retraction by hand of the inner bracket within the seated outer bracket by means of the teeth pulling on the underside of the IC chip, and, for insertion, (i) as the inner bracket is retracted by hand into the outer bracket to force the jaws to grasp a loose IC chip for insertion (before the outer housing is positioned for seating on an IC chip installation surface), (ii) as the outer housing, with the inner bracket holding the chip fully retracted within the outer housing, is seated by hand on the surface of the chip's installation, and (iii) as the chip is inserted into its installation during a hand actuated extending motion of the inner bracket in a direction extending out from the seated outer bracket, the insertion effected by means of the insertion means pushing on the topside of the grasped IC chip;

the rails forming angled overhanging lips of the parallel legs of the outer bracket for slideably engaging and forcing the jaws to pivot shut to a closed state during retraction of the inner bracket within the outer bracket, and for permitting the jaws to pivot open to an opened state during extension of the inner bracket outside the outer bracket; and the U-shaped outer housing having flat surfaces at each end of its legs forming foundation means, for securing the outer bracket firmly on the surface of the installation of the IC chip such that the direction of insertion or extraction is substantially perpendicular to the installation surface.

* * * * *